(12) United States Patent
Taniyama et al.

(10) Patent No.: US 6,247,479 B1
(45) Date of Patent: *Jun. 19, 2001

(54) WASHING/DRYING PROCESS APPARATUS AND WASHING/DRYING PROCESS METHOD

(75) Inventors: Hiroki Taniyama, Tosu; Yuji Kamikawa, Kumamoto-ken; Kotaro Tsurusaki, Onojo, all of (JP)

(73) Assignee: Tokyo Electron Limited, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/084,319

(22) Filed: May 26, 1998

(30) Foreign Application Priority Data

| May 27, 1997 | (JP) | 9-154435 |
| Jun. 9, 1997 | (JP) | 9-167967 |
| Jun. 19, 1997 | (JP) | 9-177780 |

(51) Int. Cl.⁷ ............................................. B08B 3/02
(52) U.S. Cl. .................. 134/95.2; 134/95.3; 134/133; 134/153; 134/902
(58) Field of Search .................... 134/33, 94.1, 721, 134/57 R, 902, 95.2, 95.3, 144, 153, 133

(56) References Cited

U.S. PATENT DOCUMENTS

| 5,190,065 | * | 3/1993 | Kovac et al. | 134/107 |
| 5,351,360 | * | 10/1994 | Yamasaka | 134/902 X |
| 5,375,291 | * | 12/1994 | Tateyama et al. | 15/302 |
| 5,415,691 | * | 5/1995 | Fujiyama et al. | 118/52 |
| 5,529,626 | * | 6/1996 | Stewart | 118/500 |
| 5,591,262 | * | 1/1997 | Sago et al. | 134/95.2 X |
| 5,688,322 | * | 11/1997 | Motoda et al. | 118/52 |
| 5,695,817 | * | 12/1997 | Tateyama et al. | 427/240 |
| 5,772,764 | * | 6/1998 | Akimoto | 118/319 |
| 5,803,970 | * | 9/1998 | Tateyama et al. | 118/319 |
| 5,826,129 | * | 10/1998 | Hasebe et al. | 396/611 |
| 5,853,961 | * | 12/1998 | Sakai et al. | 430/325 |
| 5,871,584 | * | 2/1999 | Tateyama et al. | 118/323 |
| 5,923,915 | * | 7/1999 | Akimoto et al. | 396/604 |
| 5,937,223 | * | 8/1999 | Akimoto et al. | 396/604 |
| 5,997,653 | * | 12/1999 | Yamasaka | 134/153 X |

* cited by examiner

Primary Examiner—Philip R. Coe
(74) Attorney, Agent, or Firm—Oblon, Spivak, McClelland, Maier & Neustadt, P.C.

(57) ABSTRACT

A washing/drying process apparatus comprises a spin chuck for holding a substrate such that a surface thereof to be processed faces upward and for rotating the substrate, a process fluid supply mechanism for selectively supplying one or two or more of a plurality of kinds of process fluids to the surface to be processed of the substrate rotated by the spin chuck, the process fluid supply mechanism having a first nozzle with a discharge port for discharging a process fluid which is in a liquid phase under conditions of room temperature and atmospheric pressure, and a second nozzle with a discharge port for discharging fluid which is in a gas phase under conditions of room temperature and atmospheric pressure, a driving mechanism for simultaneously moving the first and second nozzles to a location above the substrate held by the spin chuck, and a controller for controlling operations of the process liquid supply mechanism and the driving mechanism.

14 Claims, 13 Drawing Sheets

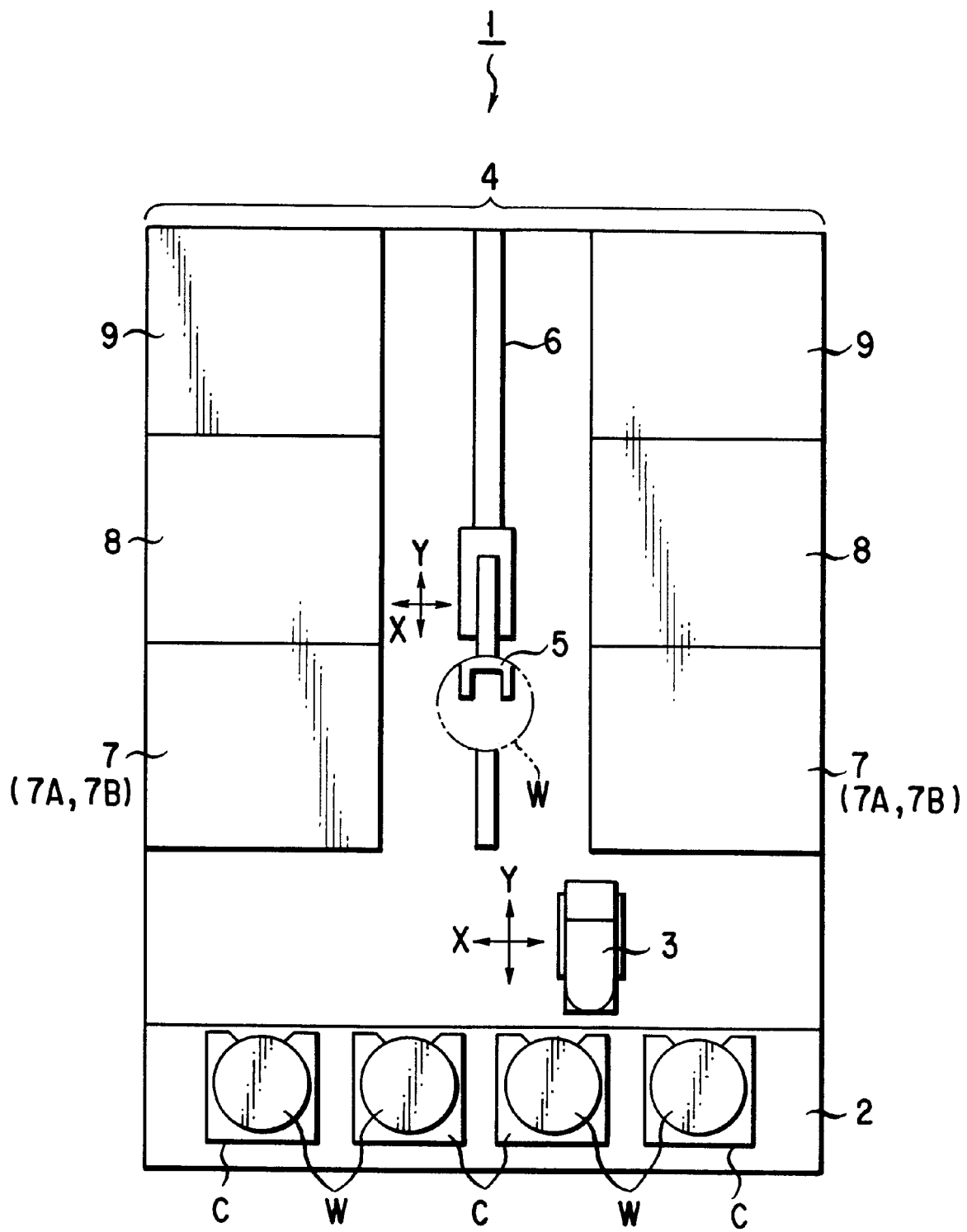
F I G. 1

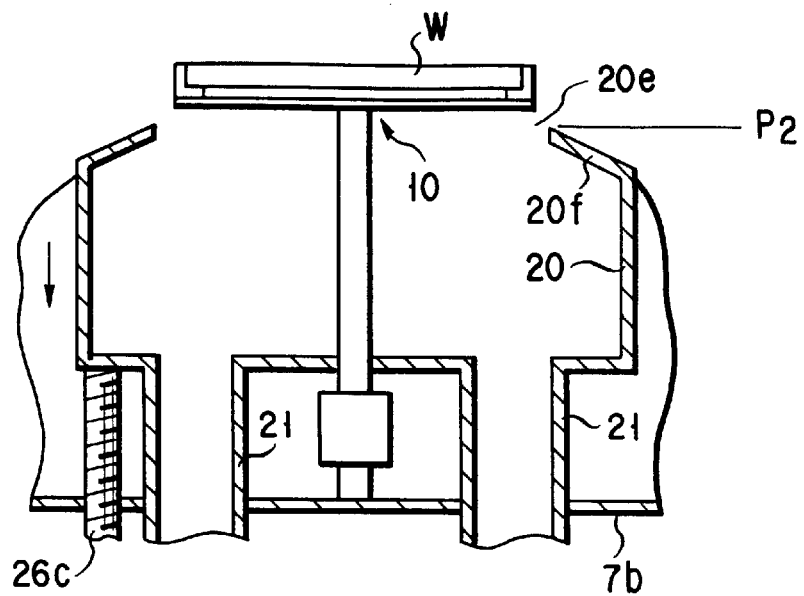
F I G. 15A
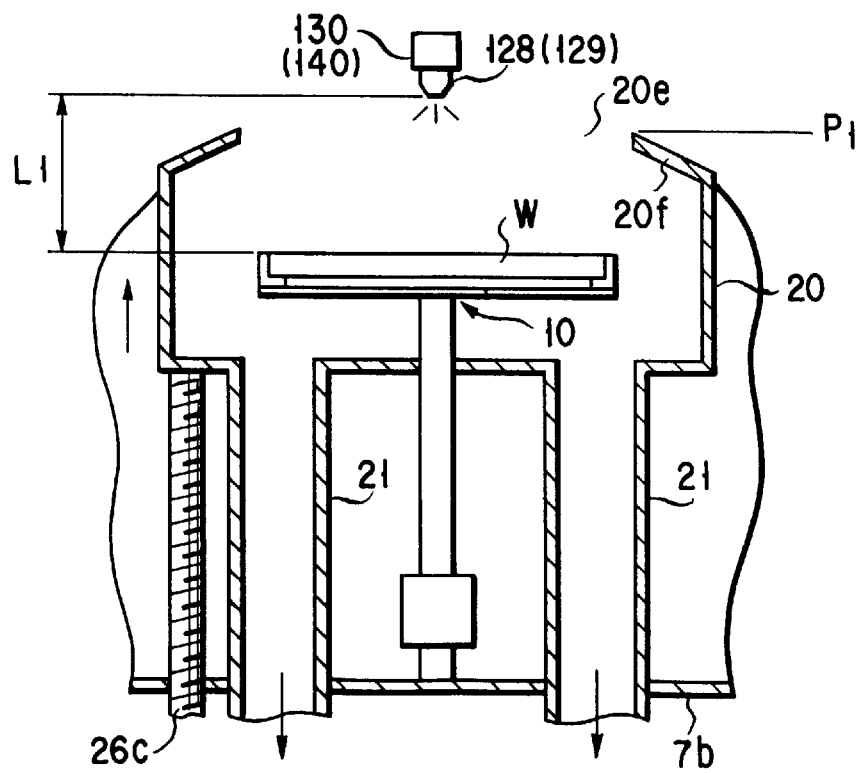
F I G. 15B

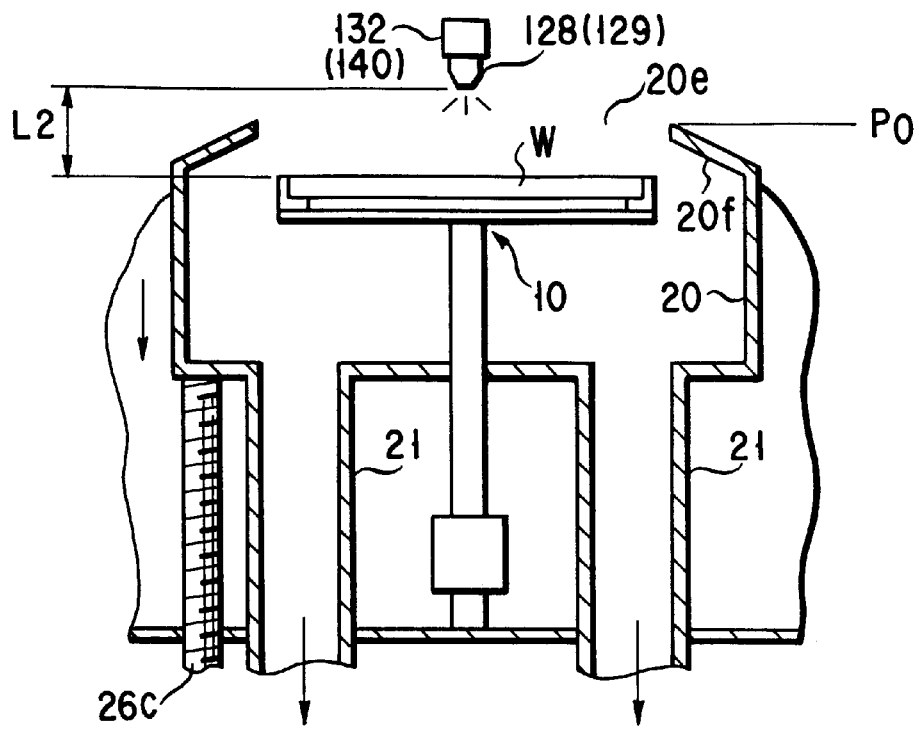
F I G. 15C
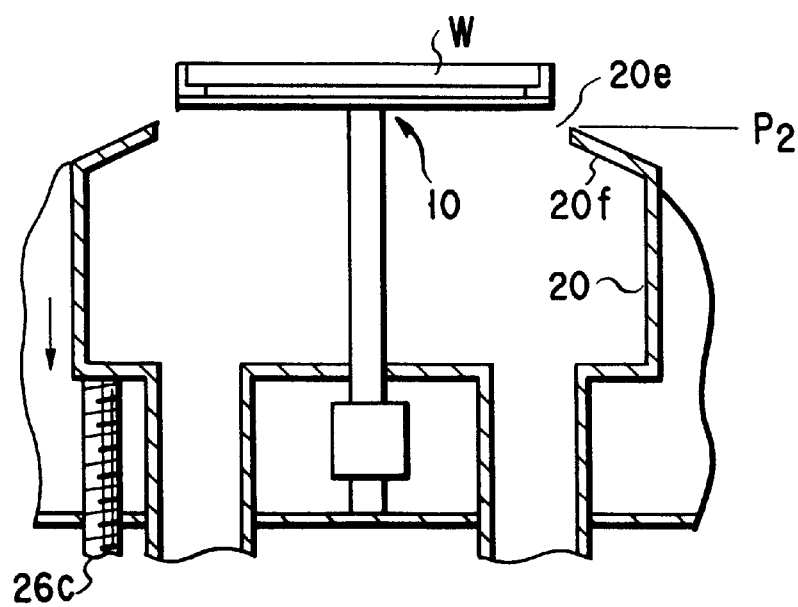
F I G. 15D

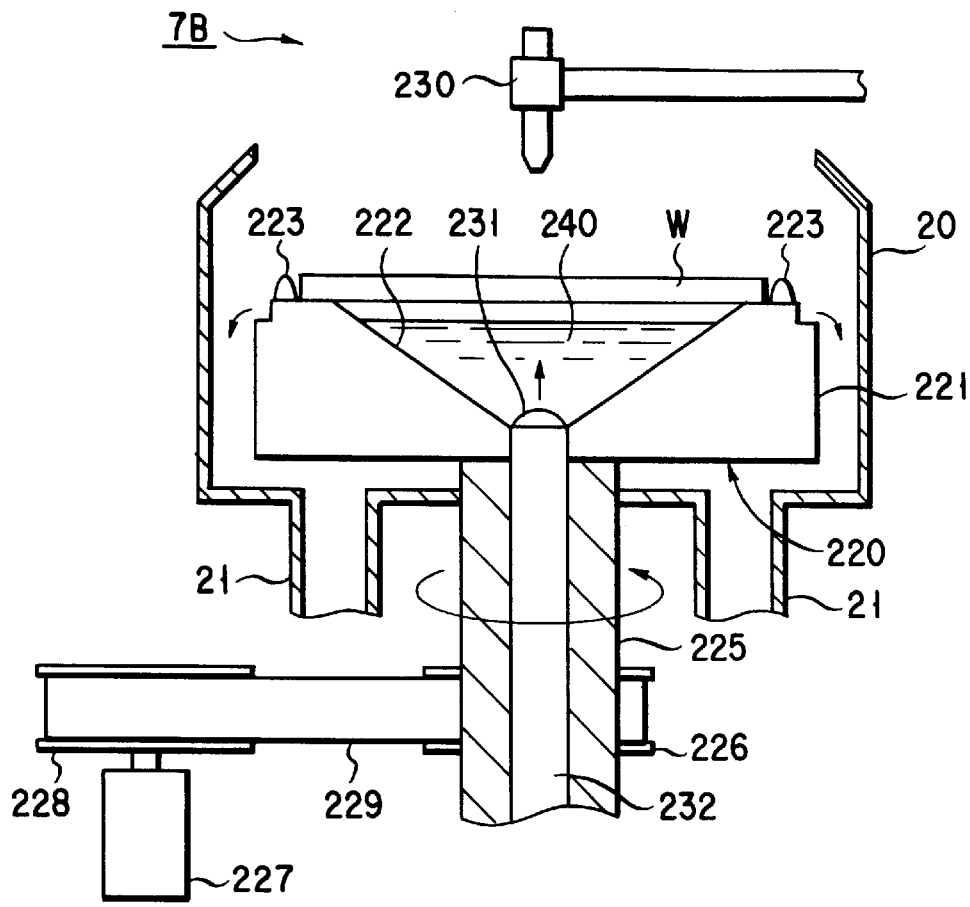
F I G. 16
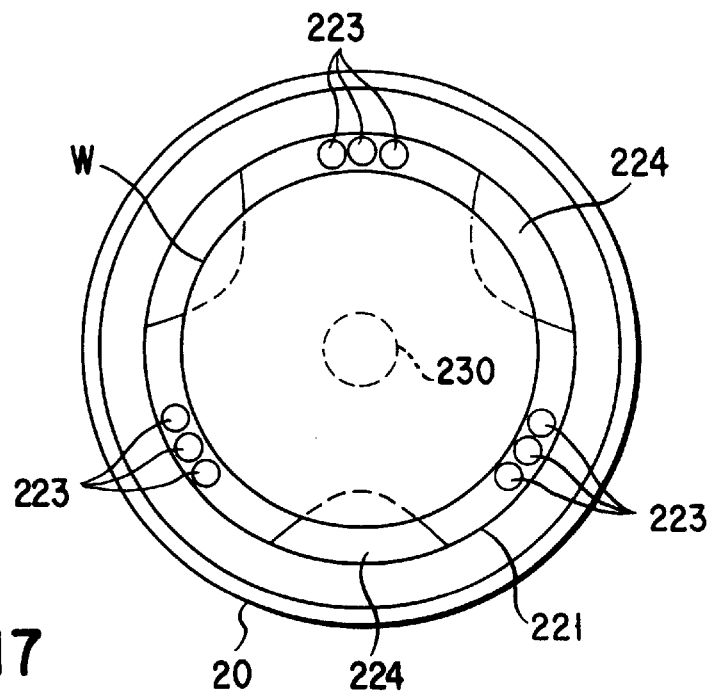
F I G. 17

WASHING/DRYING PROCESS APPARATUS AND WASHING/DRYING PROCESS METHOD

BACKGROUND OF THE INVENTION

The present invention relates to a washing/drying process apparatus and a washing/drying method for chemical-solution-washing, rinsing and drying a surface of a substrate such as a semiconductor wafer or a glass substrate for an LCD.

In a process of fabricating a semiconductor device, a washing/drying process apparatus is used in order to remove a contamination such as particles, organic substances or metal ions from the surface of the substrate. An example of the apparatus for washing and drying a semiconductor wafer is a single-wafer-type washing/drying process apparatus for processing wafers one by one within a cup. In the single-wafer-type washing/drying process apparatus, a wafer is rotated, while being held by a spin chuck, and a chemical solution is applied to the surface of the spinning wafer for chemical solution washing. Then, pure water is applied to the washed surface to rinse it. Finally, a dry $N_2$ gas is applied to dry the wafer surface.

In the conventional apparatus, a chemical solution nozzle, a rinse nozzle and a dry nozzle are provided around the cup. These nozzles are moved between the home position and use position by different drive mechanisms. In this conventional apparatus, a considerable time is needed for switching from the chemical solution nozzle to the rinse nozzle and from the rinse nozzle to the dry gas nozzle. Consequently, so-called a water mark occurs when liquid drops adhering to the surface of the wafer dry naturally. The water mark is a compound of $H_2SiO_3$ produced by reaction between oxygen and H2O in the atmosphere and silicon or by precipitation of a very small amount of $SiO_2$ included in rinse liquid (pure water) on the surface of the silicon wafer. Such a water mark may remain on the wafer surface even after the dry process.

In addition, in the conventional apparatus, when a chemical solution is applied to the rotating wafer, liquid drops separated centrifugally from the wafer adhere to the inner wall of the cup. Repetition of chemical solution wash processes results in adhesion of a great amount of liquid drops on the inner wall of the cup. This may adversely affect the subsequent rinse process. If the chemical solution drops have dried on the inner wall of the cup and their constituent has precipitated, particles of the constituent may occur and contaminate the wafer.

In the conventional apparatus, after the chemical solution wash process, the waste liquid is recovered from the cup and it is reused after regeneration. In the conventional apparatus, a recovery/regeneration apparatus for recovering and regenerating the waste liquid is disposed as a unit separated from the chemical solution wash apparatus and at a separate location. As a result, the conventional apparatus occupies a large area within the clean room. In addition, the length of the waste liquid recovery circuit (recovery piping) and the regenerated chemical solution return circuit (return piping) increases considerably. Thus, such problems will arise as an increase in capacity of a chemical solution supply pump and a variation in temperature of chemical solution.

In the conventional apparatus, in a case where the bottom surface of the wafer is hydrophobic, a process liquid, which has been applied to the bottom surface of the wafer from a bottom-side nozzle, will naturally drop from the bottom surface of the wafer before spreading over the entire bottom surface. In the conventional process apparatus, therefore, the area on the bottom surface of the wafer, which can be effectively washed, is limited.

Furthermore, the bottom surface of the wafer is not uniformly covered with the liquid, and after the process liquid has naturally dropped from the bottom surface of the wafer, the bottom surface of the wafer comes in contact with outside air in the state in which it is wet to some degree. As a result, a great number of gas-liquid interfaces occur on the bottom surface of the wafer and particles will easily occur at the gas-liquid interfaces. Consequently, particles adhere to the bottom surface of the wafer while the wash process is being performed, and the efficiency of the wash process considerably deteriorates.

BRIEF SUMMARY OF THE INVENTION

An object of the present invention is to provide a small-sized, simple-structured washing/drying process apparatus and a washing/drying process method capable of washing, rinsing and drying a surface of a substrate with a high through-put without producing a water mark.

Another object of the invention is to provide a washing/drying process apparatus and a washing/drying process method capable of immediately washing away a chemical solution, etc. on an inner wall of a cup and decreasing the length of a waste liquid recovery circuit and a return circuit.

Still another object of the invention is to provide a washing/drying process apparatus and a washing/drying process method capable of uniformly processing a lower surface of a substrate.

A washing/drying process apparatus according to the invention comprises: a spin chuck for holding a substrate such that a surface thereof to be processed faces upward and for rotating the substrate; a process fluid supply mechanism for selectively supplying one or two or more of a plurality of kinds of process fluids to the surface to be processed of the substrate rotated by the spin chuck, the process fluid supply mechanism having a first nozzle with a discharge port for discharging a process fluid which is in a liquid phase under conditions of room temperature and atmospheric pressure, and a second nozzle with a discharge port for discharging fluid which is in a gas phase under conditions of room temperature and atmospheric pressure; a driving mechanism for simultaneously moving the first and second nozzles to a location above the substrate held by the spin chuck; and a controller for controlling operations of the process liquid supply mechanism and the driving mechanism.

It is preferable that the washing/drying process apparatus further comprises a nozzle assembly in which the first and second nozzles are integrated, the discharge port of the first nozzle and the discharge port of the second nozzle being adjacent to each other in the nozzle assembly. It is also preferable that the discharge port of the first nozzle and the discharge port of the second nozzle are arranged concentrical at a lower part of the nozzle assembly. It is preferable that the discharge port of the first nozzle and the discharge port of the second nozzle are arranged symmetrical at a lower part of the nozzle assembly. It is preferable that the first nozzle has a first discharge port for discharging a chemical solution for chemical washing and a second discharge port for discharging pure water for rinsing, and the second nozzle has a third discharge port for discharging isopropyl alcohol vapor for drying and a fourth discharge port for discharging a dry inert gas for drying. Thereby, the dry gas can be applied from the second nozzle immediately after the chemical solution and rinse liquid have been discharged to the substrate from the first nozzle. Thus, the wash/rinse process and the dry process can be successively performed, and no water mark is produced.

A washing/drying process apparatus according to the invention comprises: a cup having at an upper part thereof an opening for loading and unloading a substrate; a spin chuck for holding and rotating the substrate within the cup; a process fluid supply mechanism having a plurality of nozzles for discharging and supplying a process fluid to the substrate held by the spin chuck; and a relative elevation mechanism for relatively and vertically moving at least one of the cup and the spin chuck, thereby varying a positional relationship between the substrate on the spin chuck and the cup.

The cup has an over-hang portion projecting inward so as to surround the opening and receiving the process fluid dispersed from the rotating substrate. The rinse liquid as second process fluid is indirectly applied to the over-hang portion, and dry $N_2$ gas as second process fluid is indirectly applied to the over-hand portion. Therefore, the inner wall of the cup is always kept in a clean state.

It is preferable that the washing/drying process apparatus further comprises: a recovery circuit communicating with a lower part of the cup; a recovery/regeneration tank communicating via the recovery circuit with the cup below the cup, for recovering and regenerating the process fluid exhausted from the cup; and a return circuit for returning the regenerated process fluid from the recovery/regeneration tank to the process fluid supply mechanism. It is preferable that the recovery circuit, recovery/regeneration tank, return circuit, cup, spin chuck, and process fluid supply mechanism are arranged within a single unit. Thereby, the length of the recovery circuit and return circuit is decreased, and a temperature variation in chemical solution is prevented.

It is preferable that the spin chuck has a conical reservoir with a diameter decreasing from a periphery thereof toward a center thereof, the reservoir facing a lower surface of the held substrate, and the apparatus further comprises a third nozzle opening at a lowermost part of the reservoir, the third nozzle supplying a rinse liquid to the reservoir and applying the rinse liquid to the lower surface of the held substrate.

A method of the invention for chemically washing, rinsing and drying a surface of a substrate in a single apparatus, comprises the steps of: (a) holding the substrate and starting spin-rotation of the substrate; (b) supplying a chemical solution to the rotating substrate and subjecting the surface of the substrate to a chemical washing process; (c) supplying a rinse solution to the rotating substrate and subjecting the surface of the substrate to a rinse process; (d) supplying a first dry gas to the rotating substrate and subjecting the surface of the substrate to a dry process; (e) supplying a second dry gas to the rotating substrate and subjecting the surface of the substrate to a final dry process; and (f) stopping the spin-rotation of the substrate and releasing the holding of the substrate.

It is preferable that in the steps (d) and (e), the first dry gas along with the second dry gas is supplied to the surface of the substrate. In this case, it is preferable that the first dry gas contains vapor of isopropyl alcohol, and the second dry gas is an inert gas temperature-controlled at a point higher than a boiling point of isopropyl alcohol. The inert gas is, for example, nitrogen gas, argon gas, or helium gas.

It is preferable that in the steps (b) to (e), pure water is supplied to a lower surface of the substrate, thereby preventing particles from adhering to the lower surface of the substrate.

A washing/drying process method of the invention for chemical-washing, rinsing and drying a surface of a substrate in an apparatus comprising a cup having at an upper part thereof an opening for loading/unloading the substrate, a spin chuck for holding and rotating the substrate, a relative elevation means for relatively and vertically moving the spin chuck and the cup, and a process fluid supply mechanism with a nozzle for selectively discharging and supplying one or two or more of a plurality of kinds of process liquids to the substrate, comprises: (A) relatively and vertically moving the cup and the spin chuck by the relative elevation means, setting the opening of the cup at a position lower than the pin chuck, and loading the substrate on the spin chuck; (B) relatively and vertically moving the cup and the spin chuck by the relative elevation means, setting the substrate at a first relative height position relative to the cup, and discharging a liquid-phase first process fluid from the nozzle to the substrate, thereby subjecting the surface of the substrate to a chemical washing process; (C) relatively and vertically moving the cup and the spin chuck by the relative elevation means, setting the substrate at a second relative height position relative to the cup, and discharging a liquid-phase second process fluid from the nozzle to the substrate, thereby subjecting the surface of the substrate to a rinsing process; (D) relatively and vertically moving the cup and the spin chuck by the relative elevation means, setting the substrate at the first relative height position relative to the cup, and discharging a gas-phase first process fluid from the nozzle to the substrate, thereby subjecting the surface of the substrate to a dry process; (E) relatively and vertically moving the cup and the spin chuck by the relative elevation means, setting the substrate at the second relative height position relative to the cup, and discharging a gas-phase second process fluid from the nozzle to the substrate, thereby subjecting the surface of the substrate to a final dry process; and (F) relatively and vertically moving the cup and the spin chuck by the relative elevation means, setting the opening of the cup at a position lower than the spin chuck, and unloading the substrate from the spin chuck.

It is preferable that in the step (C) or (E) the liquid-phase second process fluid is supplied to the substrate before setting the substrate at the second relative height position. In addition, it is preferable that in the step (D) the gas-phase second process fluid along with the gas-phase first process fluid is supplied to the substrate. It is preferable that in the step (B) the liquid-phase first process fluid is recovered, regenerated, returned to the process fluid supply mechanism, and resupplied to the substrate from the nozzle. It is preferable that in the step (D) the gas-phase first process fluid is recovered, regenerated, returned to the process fluid supply mechanism, and resupplied to the substrate from the nozzle. In addition, it is preferable that the gas-phase first process fluid contains vapor of isopropyl alcohol, and the gas-phase second dry process fluid is an inert gas temperature-controlled at a point higher than a boiling point of isopropyl alcohol.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a plan view showing a washing/drying system for washing a surface of a semiconductor wafer with a chemical solution, rising the surface and drying the surface;

FIGS. 15A to 15D are see-through cross-sectional views showing various states of the washing/drying apparatus in order to describe the method illustrated in FIG. 14;

FIG. 16 is a see-through cross-sectional view showing a bottom-surface process apparatus for processing a bottom surface of a substrate; and FIG. 17 is a plan view showing the upper side of the bottom-surface process apparatus.

DETAILED DESCRIPTION OF THE INVENTION

Figure 2:
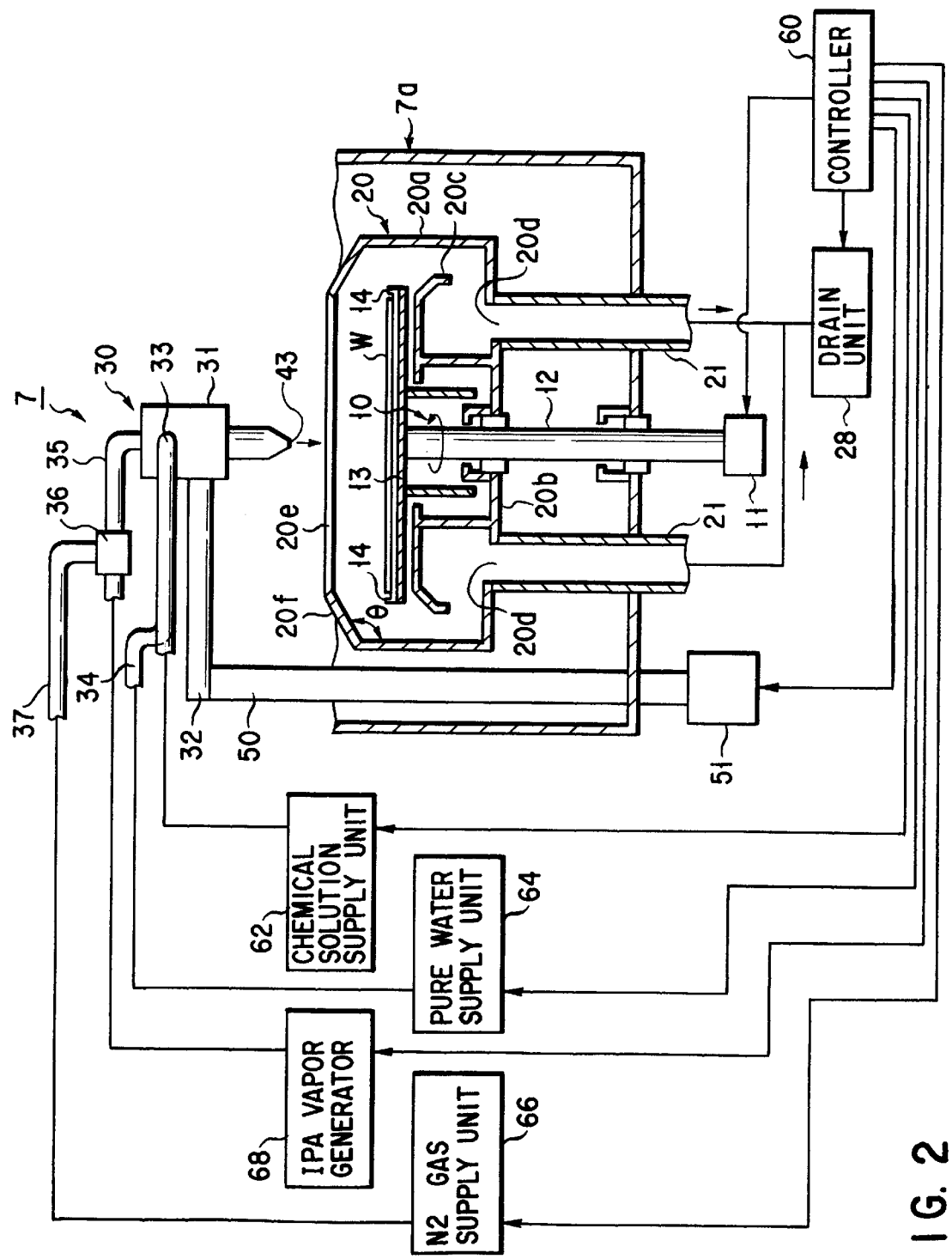
FIG. 2 is a cross-sectional block diagram showing a washing/drying process apparatus according to an embodiment of the present invention.

Preferred embodiments of the present invention will now be described with reference to the accompanying drawings.

A washing/drying system 1, as shown in FIG. 1, comprises a cassette mount section 2, a sub-arm mechanism 3, a process section 4 and a main arm mechanism 5. Four cassettes C each storing 25 wafers W are arranged on the cassette mount section 2. The sub-arm mechanism 3 takes out non-washed wafers W from the cassettes C and transfers them onto the main arm mechanism 5, or receives washed wafers W from the main arm mechanism 5 and restores them into the cassettes C.

The process section 4 is provided with a Y-axis transfer path 6 for movement of the main arm mechanism 5. Process units 7 (7A, 7B), 8 and 9 are successively provided on both sides of the Y-axis transfer path 6. Specifically, each pair of process units 7 (7A, 7B), 8 and 9 are opposed to each other, with the transfer path 6 interposed.

The main arm mechanism 5 comprises a wafer holder, an advancing mechanism for advancing the wafer holder, a Y-axis drive mechanism for driving the wafer holder in the Y-axis direction, a Z-axis drive mechanism for driving the wafer holder in the Z-axis direction, and a θ rotary drive mechanism for rotating the wafer holder about the Z-axis.

At first, the wafer W is washed with a chemical solution in the first process unit 7, rinsed and dried. Then the wafer W is washed with another chemical solution in the second process unit 8, rinsed and dried. At last the wafer W is rinsed with pure water in the third process unit 9 and dried.

The process unit 7, 8, 9 will now be described. Since the process units 7, 8 and 9 have substantially the same construction, the first process unit 7 will be described representatively.

Figure 3:
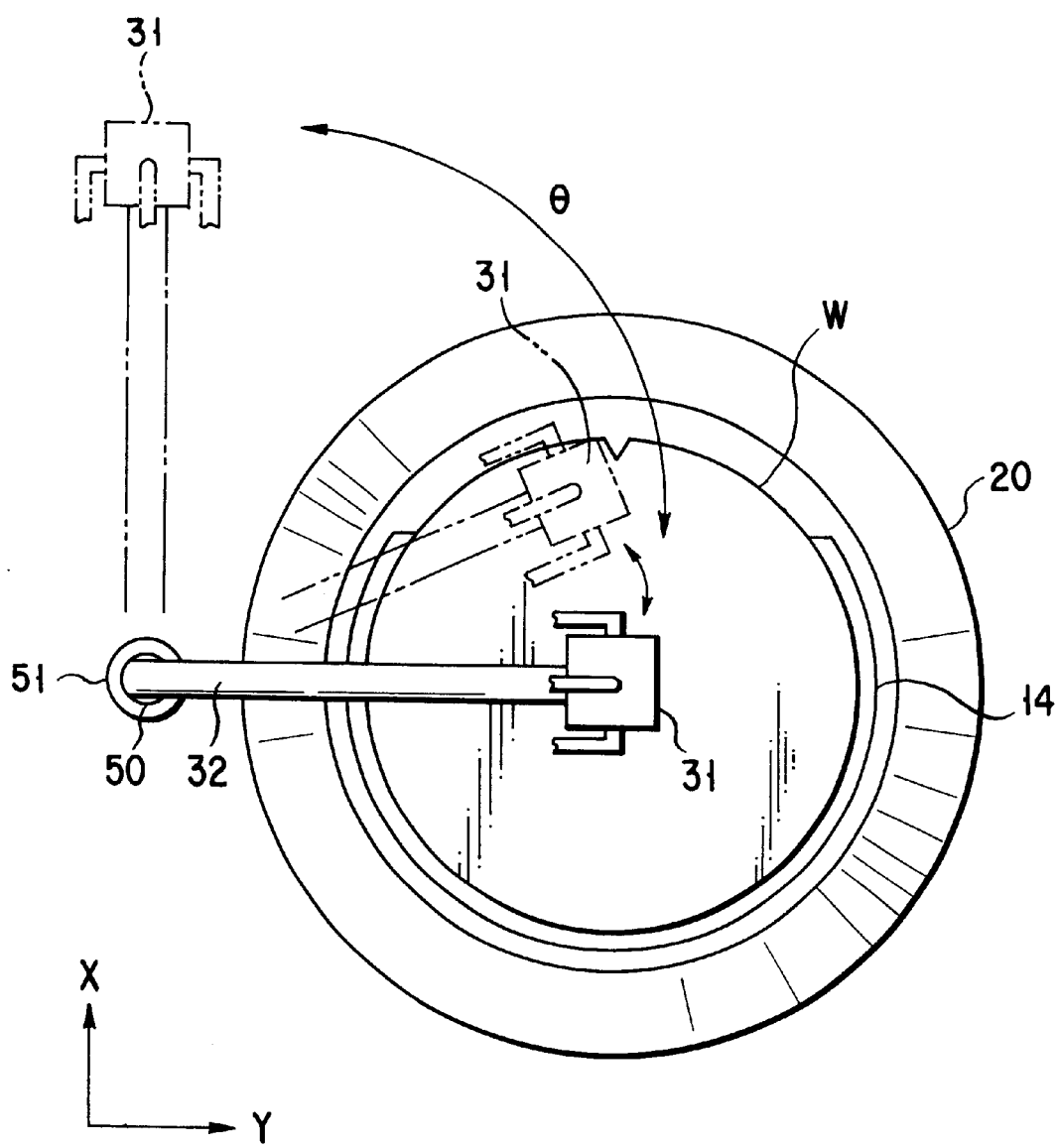
FIG. 3 is a plan view showing the washing/drying process apparatus according to the embodiment.

The process unit 7 has a casing 7a, as shown in FIG. 2. A spin chuck 10, a cup 20 and a process fluid supply mechanism 30 are provided within the casing 7a. The spin chuck 10 has a motor 11, a table 13 and a wafer holder 14. The motor 11 is disposed below the casing 7a, and its rotary drive shaft 12 is coupled to the lower surface of the table 13. The wafer holder 14 is erected on a peripheral portion of the table 13 and is put in contact with an outer peripheral portion of the wafer W. The wafer W is thus held in the state in which the wafer W is floated above the table 13. A part of the wafer holder 14 is cut out to permit transfer of the wafer W, as shown in FIG. 3.

The cup 20 comprises a cylindrical portion 20a, a bottom portion 20b, an inner guide portion 20c, a discharge port 20d, an upper opening 20e and an over-hang portion 20f. A space for downward flow of waste liquid is defined between the cylindrical portion 20a and inner guide portion 20c. A plurality of exhaust ports are formed in the bottom portion 20b and communicate with exhaust pipes 21. The over-hang portion 20f is continuous with an upper portion of the cylindrical portion 20a. The upper opening 20e is surrounded by the over-hang portion 20f. The angle θ between the over-hang portion 20f and cylindrical portion 20a is set in a range of from 110° to 135°.

An atmospheric gas within the cup 20 is exhausted by a vacuum pump (not shown) having a suction port communicating with the bottom of the cup 20. A process liquid separated centrifugally from the wafer W is exhausted to a drain unit 61 via the exhaust pipes 21 opening to the bottom of the cup 20.

Figure 4:
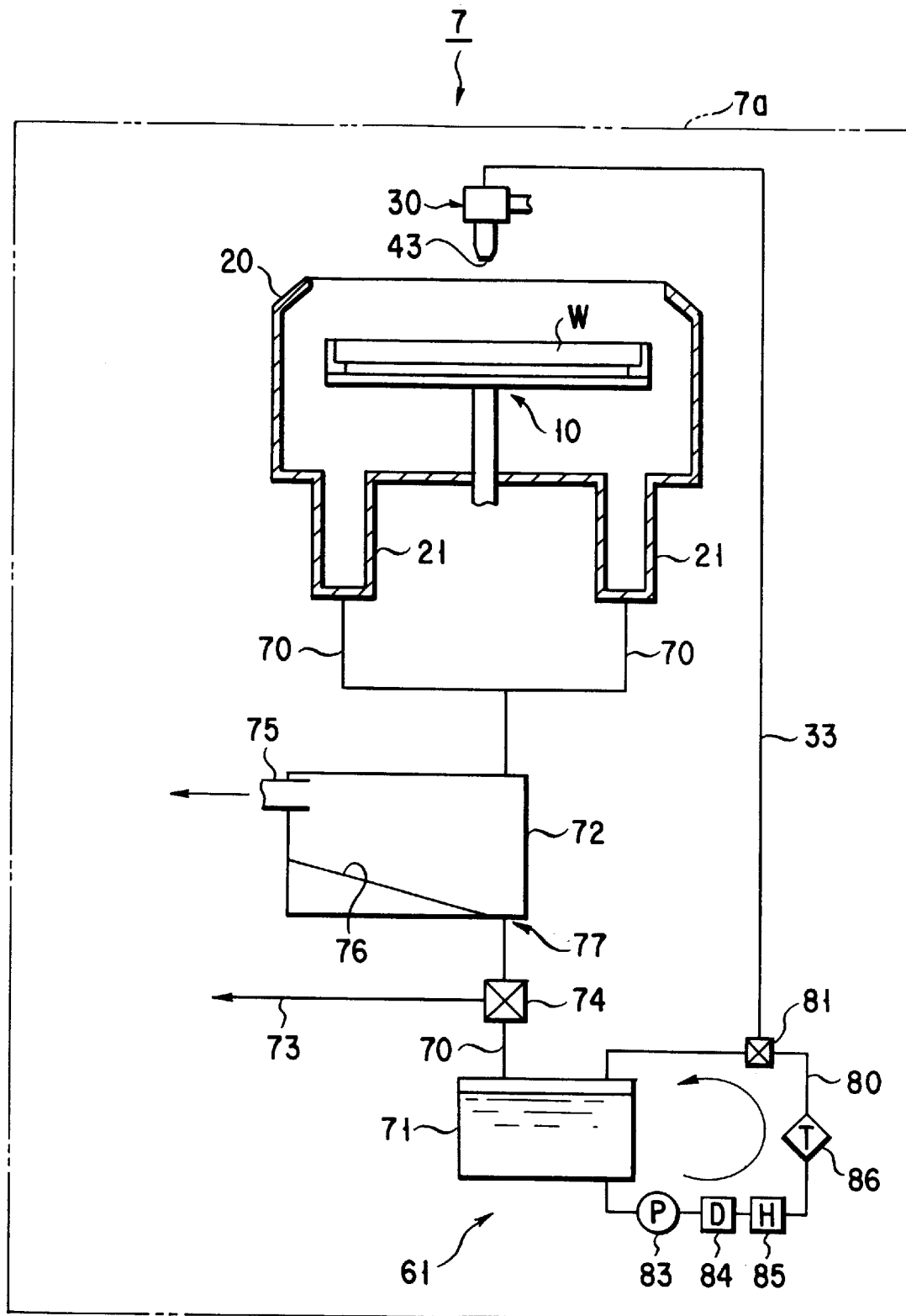
FIG. 4 is a circuit diagram showing a circuit for supplying and recovering a washing chemical solution.

Referring to FIG. 4, recovery and regeneration of waste liquid in the drain unit 61 will now be described.

The drain unit 61 is provided within the single unit casing 7a along with the spin chuck 10, cup 20 and process liquid supply mechanism 30. The drain unit 61 comprises a recovery circuit 70, a tank 71, a gas-liquid separator 72, a circulation circuit 80 and a return circuit 33.

A chemical solution, pure water, IPA (isopropyl alcohol) vapor and $N_2$ gas are all exhausted from the cup 20 through the discharge pipes 21 to the drain unit 61. The recovery circuit 70 communicates with the discharge pipes 21, and the outlet of the recovery circuit 70 communicates with the tank 71 disposed below the cup 20. The gas-liquid separator 72 and drain circuit 73 are arranged successively in this order from above between the recovery circuit 70 and tank 71. The drain circuit 73 communicates with the recovery circuit 70 via an opening/closing valve 74.

The gas-liquid separator 72 separates the process fluid coming in from the discharge pipes 21 via the recovery circuit 70 into process liquids, such as chemical solution and pure water, and process gases such as IPA vapor and $N_2$ gas. The gas-liquid separator 72 also eliminates bubbles from the chemical solution. Specifically, the process liquids such as IPA vapor and $N_2$ gas, which are included in the process fluid coming into the gas-liquid separator 72, are exhausted from an exhaust port 75 provided at an upper portion of the gas-liquid separator 72, and the process liquids such as chemical solution and pure water are let to flow along an inclined table 76 set in the separator 52. While the process liquids are flowing, gas components are exhausted from the exhaust port 75 and liquid components are supplied once again into the recovery circuit 70 from an exhaust liquid port 77 provided at a bottom portion of the gas-liquid separator 72.

The three-way valve 74 is operated to exhaust the pure water of process liquids separated by the gas-liquid separator, which has been used in the rinse process, to the drain circuit 73 from the recovery circuit 70. The chemical solution of process liquids is received in the tank 71. Since the tank 71 is provided below the cup 20, the length of the recovery circuit 70 can be decreased and the used chemical solution can be quickly recovered into the tank 71 by natural drop.

The circulation circuit 80 for conditioning the chemical solution stored in the tank 71 is connected to the tank 71. The return circuit 33 is connected midway along the circulation circuit 80 via a three-way valve 81. The outlet of the return circuit 33 is connected to the process liquid supply mechanism 30. The chemical solution from the tank 71, which has been conditioned by the circulation circuit 80, is returned to the nozzle of the supply mechanism 30.

The inlet of the circulation circuit 80 is connected to the bottom surface of the tank 71. A pump 83, a damper 84, a heater 85 and a filter 86 are successively arranged midway along the circulation circuit 80. The outlet of the circulation circuit 80 is connected to the upper part of the tank 70. The three-way valve 81 may be switched to prevent the chemical solution from flowing to the return circuit 33 and to permit the chemical solution recovered from the recovery circuit 70 into the tank 71 to flow to the circulation circuit 80. The chemical solution coming in the circulation circuit 80 is let to flow successively through the damper 84, heater 85 and filter 86 by the operation of the pump 83. Thus, the chemical solution is temperature-conditioned and purified and then returned to the tank 71.

The regenerated chemical solution in the tank 71 is let to flow to the return circuit 33 by switching the three-way valve 81. The chemical solution returned to the nozzle of supply mechanism 30 through the return circuit 33 is reused for the washing process of the wafer W.

The process fluid supply mechanism 30 and nozzle assembly 31 will now be described with reference to FIGS. 2, 3 and 5–11.

The process fluid supply mechanism 30 comprises a nozzle assembly 31, a chemical solution supply unit 62, a pure water supply unit 64, an $N_2$ gas supply unit 66, an IPA vapor generator 68, and a controller 60. The nozzle assembly 31 is attached to a distal end portion of a horizontal arm 32. As is shown in FIG. 3, the nozzle assembly 31 is swung about a vertical shaft 50 by means of a drive mechanism 51 between a home position (outside the cup 20) and a use position (inside the cup 20). The respective supply units 62, 64, 66 and 68 communicate with the nozzle assembly 31 via line tubes 33, 34, 35 and 37. The line tubes 33, 34, 35 and 37 are made of fluororesin or stainless steel and are flexible. Flow rate control valves (not shown) of the supply units 62, 64, 66 and 68 are controlled by the controller 60.

Figure 5:
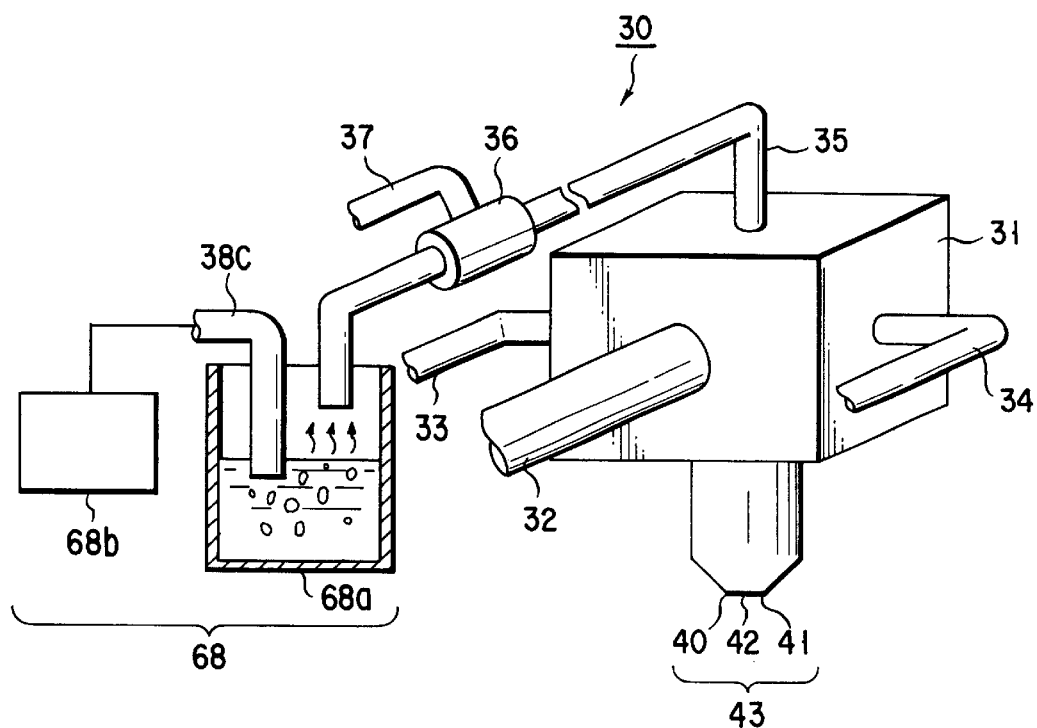
FIG. 5 is a perspective block diagram showing a collective nozzle block (nozzle assembly)
Figure 6:
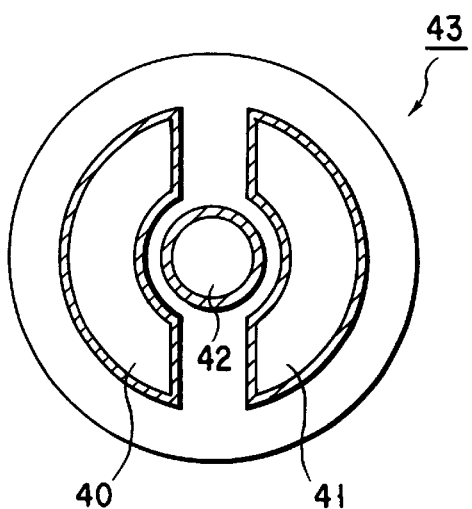
FIG. 6 is a partially enlarged plan view showing a liquid discharge portion of the collective nozzle block (nozzle assembly)
Figure 7:
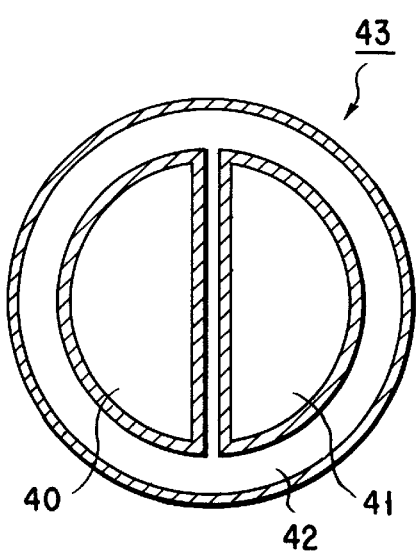
FIG. 7 is a partially enlarged plan view showing a modification of the liquid discharge portion of the collective nozzle block (nozzle assembly)
Figure 8:
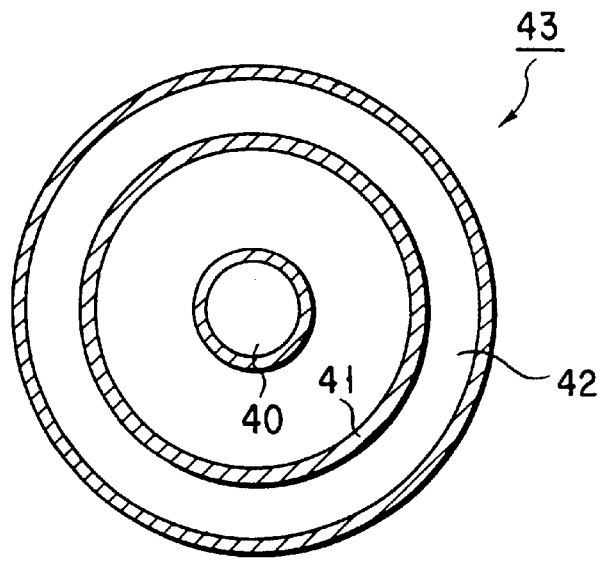
FIG. 8 is a partially enlarged plan view showing a modification of the liquid discharge portion of the collective nozzle block (nozzle assembly)

As is shown in FIG. 5, the main body of the nozzle assembly 31 has a rectangular shape. The horizontal arm 32 is coupled to one side surface of the assembly 31. The line tubes 33 and 34 are connected to other mutually opposed side surfaces of the assembly 31. The line tube 35 is connected to the top surface of the assembly 31. A collective nozzle member 43 is attached to the bottom surface of the assembly 31. The respective line tubes 33, 34 and 35 are connected to discharge ports 40, 41 and 42 of the collective nozzle member 43 via internal passages (not shown). The first to third discharge ports 40, 41 and 42 may be arranged symmetrical, as shown in FIGS. 6 and 7, or may be arranged concentric, as shown in FIG. 8.

The first discharge port 40 communicates with the line tube 33, and the line tube 33 communicates with the chemical solution supply unit 62. The second discharge port 41 communicates with the line tube 34, and the line tube 34 communicates with the pure water supply unit 64. The third discharge port 42 communicates with the line tube 35, and the line tube 35 communicates with the IPA vapor generator 68 via a three-way valve 36.

As is shown in FIG. 5, the IPA vapor generator 68 comprises a tank 68$a$, an $N_2$ gas source 68$b$ and a take-in pipe 68$c$. If $N_2$ gas is introduced into IPA liquid in the tank 68$a$ via the take-in pipe 68$c$ from the $N_2$ gas source 68$b$, IPA vapor is generated by gas bubbling. The IPA vapor (first dry gas) is discharged from the third discharge port 42 of collective nozzle member 43 through the line tube 35. One passage of the three-way valve 36 communicates with the line tube 37. Dry $N_2$ gas (second dry gas) is introduced from another $N_2$ gas source 66 via the line tube 37, and the IPA vapor is mixed with the dry $N_2$ gas in the line tube 35. Instead of using the mixture of the IPA vapor and dry $N_2$ gas, it is possible to use the IPA vapor alone as dry gas.

As is shown in FIG. 3, the nozzle assembly 31 is reciprocally moved in a horizontal plane between the home position and use position by the swing mechanism 50, 51. By moving the nozzle assembly 31 only once, it is possible to perform a series of processes for chemical-washing, rinsing and drying the wafer W. A receiving cup (not shown) may be provided at the home position of the nozzle assembly 31 so that the discharge ports 40, 41 and 42 of the collective nozzle member 43 in the wait position may be received in the cup and cleaned.

Figure 9:
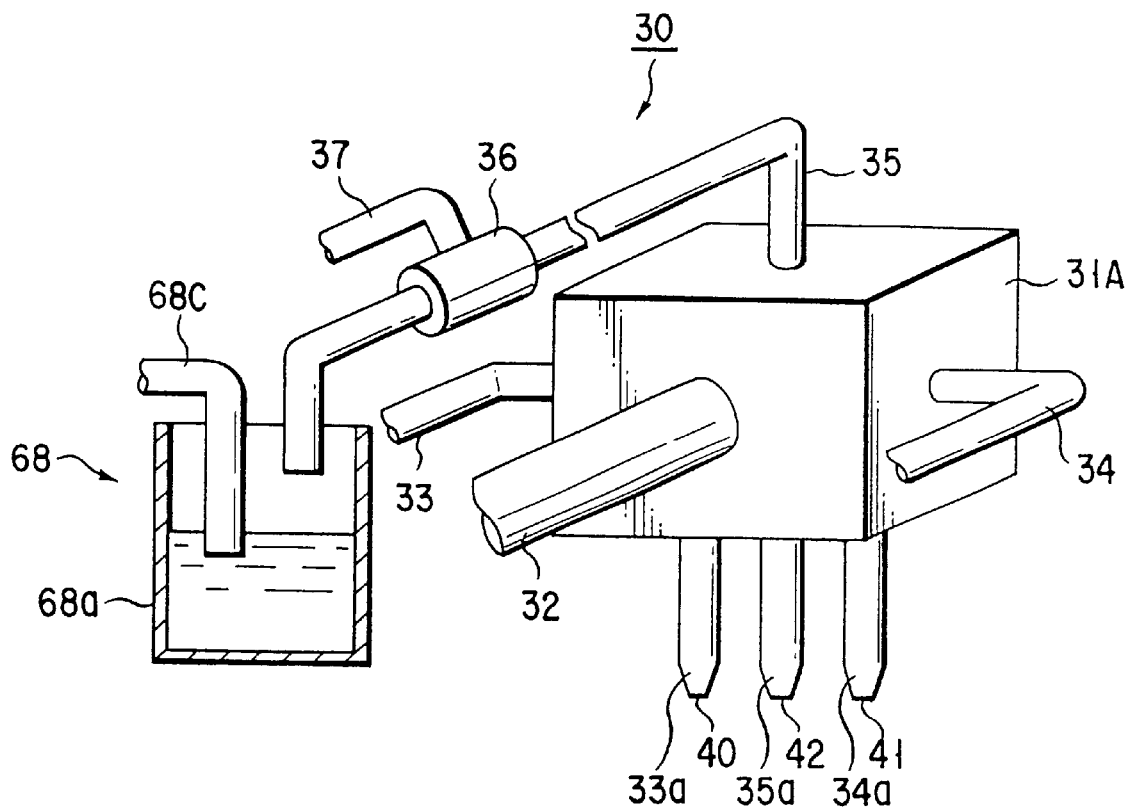
FIG. 9 is a perspective block diagram showing another collective nozzle block (nozzle assembly)

FIG. 9 shows a nozzle assembly 31A according to another embodiment of the invention. The nozzle assembly 31A comprises three separate nozzles 33$a$, 34$a$ and 35$a$. The nozzles 33$a$, 34$a$ and 35$a$ are linearly arranged on the lower surface of the nozzle assembly 31A. The discharge port of the first nozzle 33$a$ communicates with the line tube 33, the discharge port of the second nozzle 34$a$ communicates with the line tube 34, and the discharge port of the third nozzle 35$a$ communicates with the line tube 35.

Figure 10:
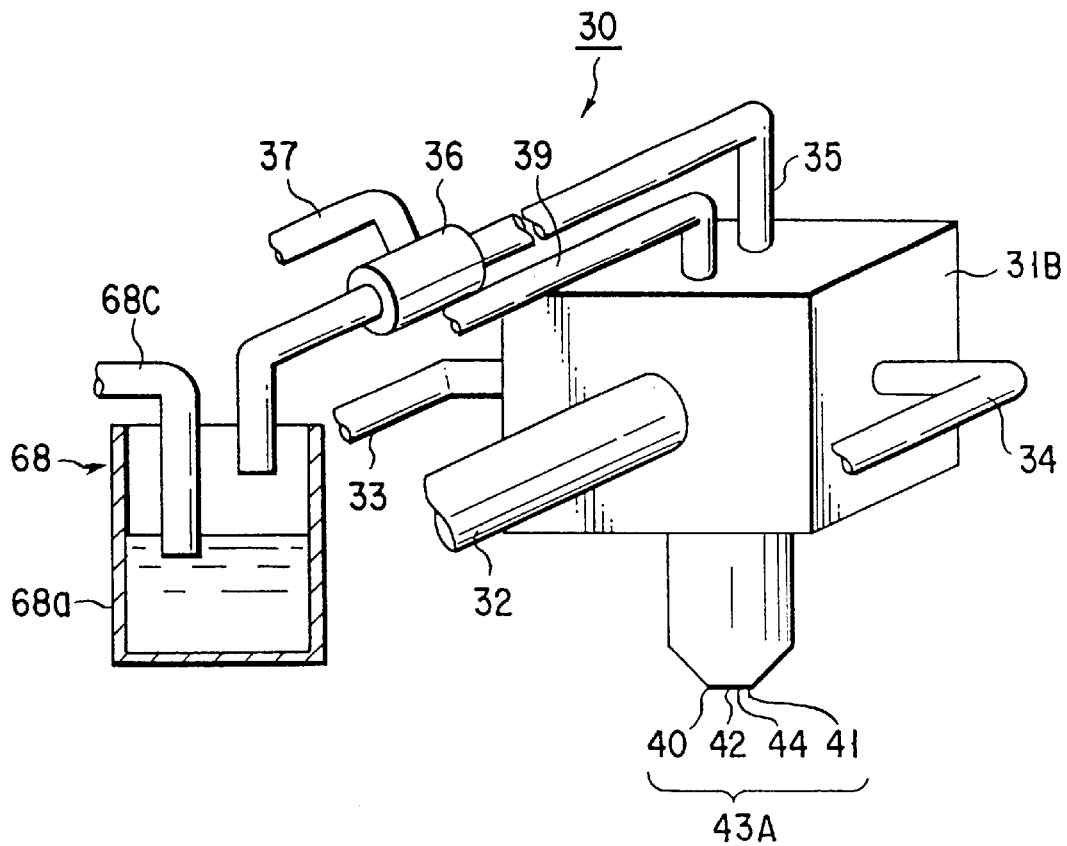
FIG. 10 is a perspective block diagram showing another collective nozzle block (nozzle assembly)
Figure 11:
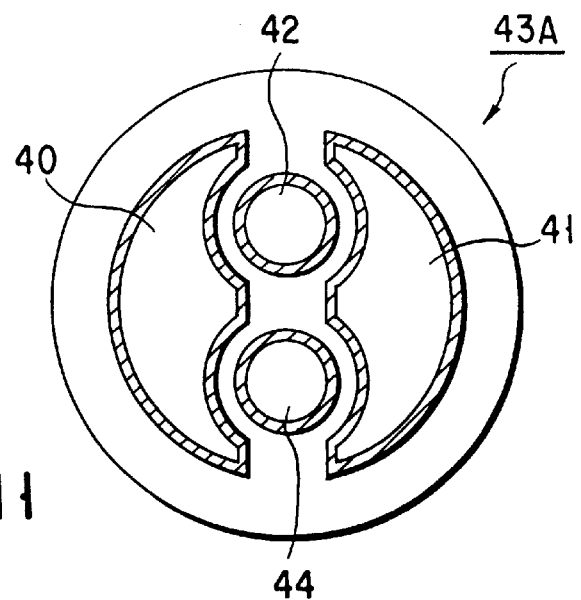
FIG. 11 is a partially enlarged plan view showing a liquid discharge portion of the collective nozzle block (nozzle assembly) shown in FIG. 10.

FIGS. 10 and 11 show a nozzle assembly 31B according to still another embodiment of the invention. A collective nozzle member 43A of nozzle assembly 31B has four discharge ports 40, 41, 42 and 44. Although the first, second and third discharge ports 40, 41 and 42 are substantially the same as those in the embodiment shown in FIG. 5, the fourth discharge port 44 is newly added. The added fourth discharge port 44 communicates with the $N_2$ gas supply unit 66 via the line tube 39 and discharges only dry $N_2$ gas.

Figure 12:
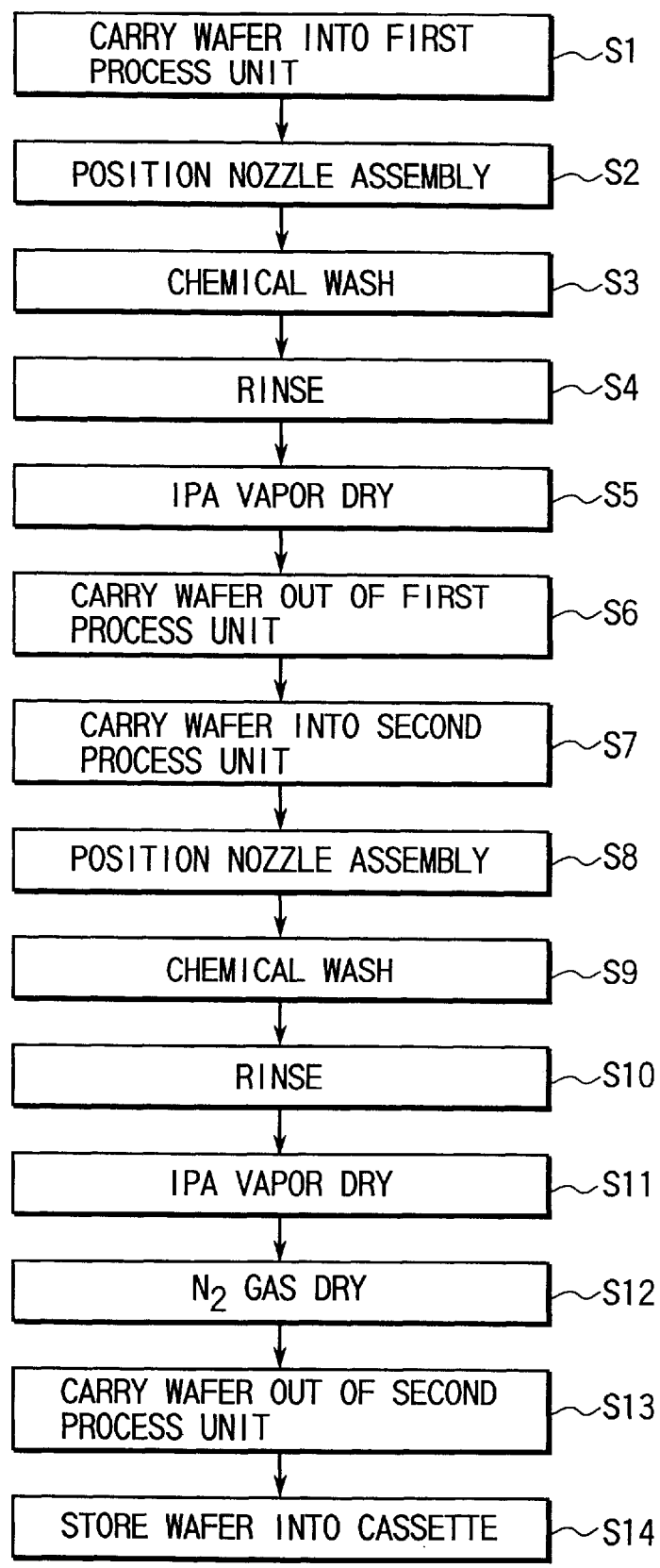
FIG. 12 is a flow chart illustrating a washing/drying method according to an embodiment of the invention.

With reference to FIG. 12, a description will now be given of the case of washing the surface of the semiconductor wafer W twice by using two kinds of chemical solutions.

The cassette C is placed on the mount section 2 by means of a transfer robot (not shown). The cassette C contains 25 prewashed, non-processed semiconductor wafers W. The sub-arm mechanism 3 takes out one of the wafers W from the cassette C, and transfers this wafer W to the main arm mechanism 5. The main arm mechanism 5 carries the wafer W into the first process unit 7 and places it on the table 13 of spin chuck 10 (step S1). The spin chuck 10, cup 20 and nozzle assembly 31 are relatively moved, and the cup 20 and nozzle assembly 31 are positioned relative to the wafer W (step S2).

The spin chuck 10 is rotated at low speed, and a chemical solution is supplied to the line tube 33 of the nozzle assembly 31. The chemical solution is discharged from the discharge port 40 onto the wafer W, and applied to the upper surface of the wafer W (step S3). In the first washing process, a mixture solution of ammonia solution and hydrogen peroxide solution for example, is used as the chemical solution, thereby eliminating contaminants such as organic substance or particles from the surface of the wafer W.

The valve of the line tube 33 is closed, and the valve of the line tube 34 is opened. Pure water is supplied to the nozzle assembly 31, and pure water is discharged from the discharge port 41 onto the wafer W. The chemical-washed surface of the wafer W is thus rinsed (step S4). The valve of the line tube 34 is closed to stop the supply of pure water. The wafer W is then rotated at high speed, and water is separated and removed from the wafer W by centrifugal force.

The three-way valve 36 of line tubes 35 and 37 is opened, and a mixture gas (first dry gas) of IPA vapor and $N_2$ gas is supplied to the nozzle assembly 31. The firs dry gas is applied from the discharge port 42 to the wafer W, thus drying the wafer W (step S5). The drying step for the wafer W may be finished in this step S5 alone. It is preferable, however, to apply dry $N_2$ gas (second dry gas) to the wafer W in the next step S6. Since IPA vapor contains particles of carbon, etc., the particles remaining on the surface of the wafer W are removed by the additional drying step using only $N_2$ gas, following the drying step using the mixture gas of IPA vapor and $N_2$ gas. In this case, if the $N_2$ gas is preheated, even if IPA component remains on the surface of the wafer W, the remaining IPA component can be evaporated and removed by the heat of the $N_2$ gas. It is preferable that the $N_2$ gas in this case be preheated at a temperature higher than the boiling point of IPA vapor.

If the primary drying step using IPA vapor and the secondary drying step using dry $N_2$ gas (final drying) are combined, the surface of the wafer W can be completely dried. In the above steps S3 to S6, the nozzle assembly 31 stays at a fixed position above the wafer W.

The main arm mechanism 5 carries out the wafer W from the first process unit 7 (step S7) and then carries it into the second process unit 8 (step S8). The nozzle assembly 31, spin chuck 10, and cup 20 are relatively moved, and the nozzle assembly 31 is positioned relative to the wafer W on the table 13 (step S9).

The spin chuck 10 is rotated at a predetermined speed, and a chemical solution is supplied to the line tube 33 of the nozzle assembly 31. The chemical solution is discharged from the discharge port 40 onto the wafer W, and applied to the upper surface of the wafer W (step S10). In the second washing process, hydrofluoric acid solution is used as the chemical solution.

Pure water is supplied to the line tube 34 of nozzle assembly 31, and pure water is discharged from the discharge port 41. The chemical-washed surface of the wafer W is thus rinsed (step S11). Following the rinsing step S11, the wafer W is rotated at high speed, and liquid is separated and removed from the wafer W by centrifugal force.

The three-way valve 36 of line tubes 35 and 37 is opened, and a mixture gas (first dry gas) of IPA vapor and $N_2$ gas is supplied to the nozzle assembly 31. The firs dry gas is applied from the discharge port 42 to the wafer W, thus drying the wafer W (step S12). The drying step for the wafer W may be finished in this step S5 alone. It is preferable, however, to apply dry $N_2$ gas to the wafer W in the next step S6. Specifically, $N_2$ gas is supplied to the line tube 39 of nozzle assembly 31, and the $N_2$ gas is applied from the discharge port 44 to the washed surface of the wafer W, thereby finally drying the washed surface (step S13). If the primary drying step using IPA vapor and the secondary drying step using dry $N_2$ gas (final drying) are combined, the surface of the wafer W can be completely dried. Thus, impure substances such as organic contaminants and particles on the surface of the wafer W can be removed.

The main arm mechanism 5 carries out the wafer W from the second process unit 8 (step S14) and then stores the processed wafer W in the cassette C of cassette station 2 (step S15). If the cassette C is filled with processed wafers W, the cassette C along with wafers W is carried to the outside. It is possible to finally wash the wafer W in the process unit 9 using a third chemical solution and then dry it.

According to this embodiment, the three processes of chemical solution washing, rinsing and drying can carried out by the single nozzle assembly. Thus, the step of chemical solution washing and rinsing can be quickly switched to the drying step, and occurrence of so-called water marks (stains due to local oxidation reaction between liquid drops and atmosphere on the wafer surface) can be prevented, and the through-put increased.

In addition, since the final drying step using $N_2$ gas along is added to the primary drying step using the mixture gas of IPA vapor and $N_2$ gas, it is possible to prevent contamination such as carbon from remaining on the surface of the wafer W.

According to the above embodiment, the chemical solution/rinsing process through the drying process can be successively performed, and no water mark is produced. In the conventional apparatus much time is needed for the switching from the nozzle for chemical solution/rinsing process to the drying process. By contrast, in the present embodiment, the operation for switching of the nozzle is not required, and the through-put is greatly increased.

A second embodiment of the present invention will now be described with reference to FIGS. 13, 14 and 15A to 15D. A description of the parts common to those of the first embodiment is omitted.

Figure 13:
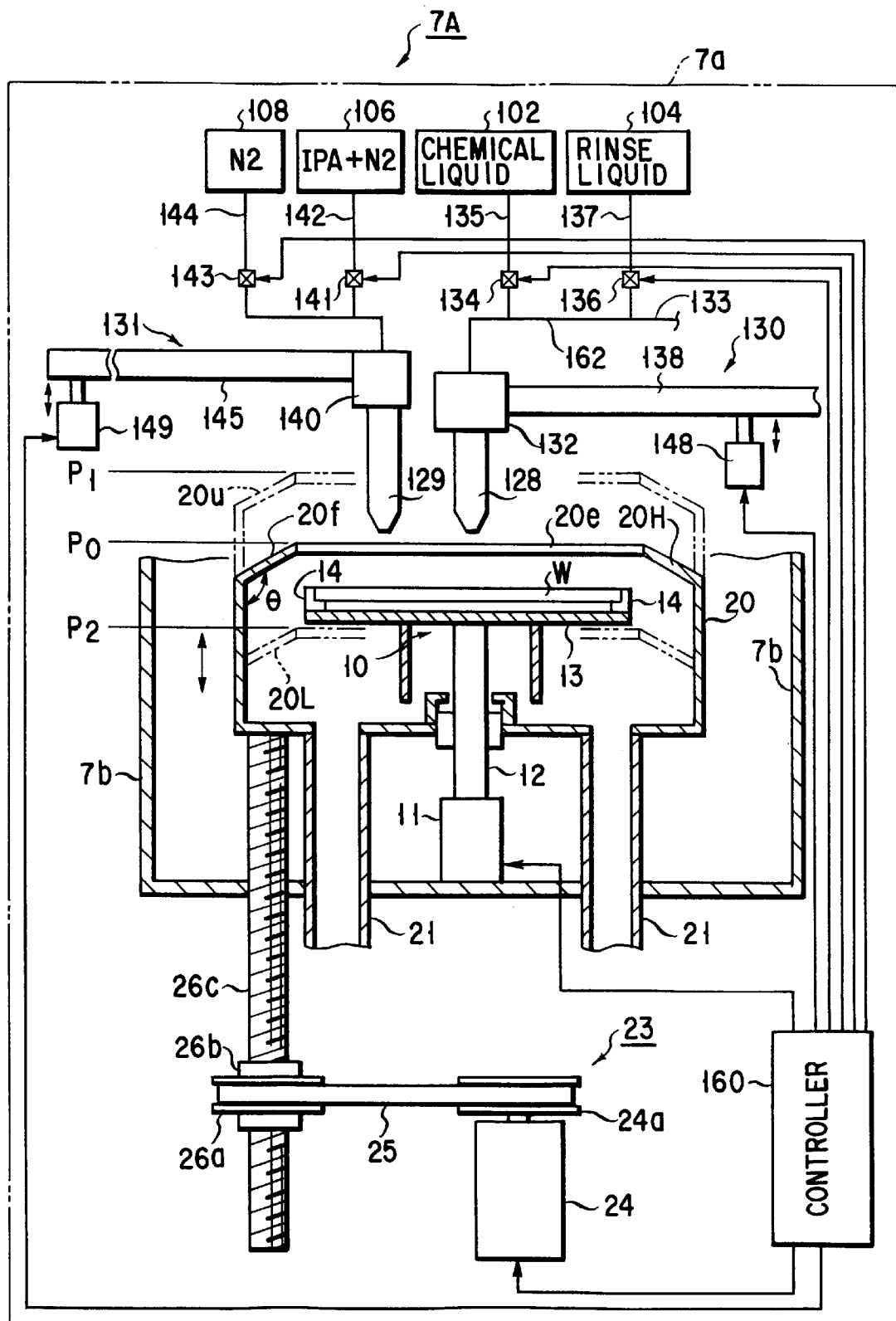
FIG. 13 is a cross-sectional block diagram showing a washing/drying process apparatus according to another embodiment of the invention.
Figure 14:
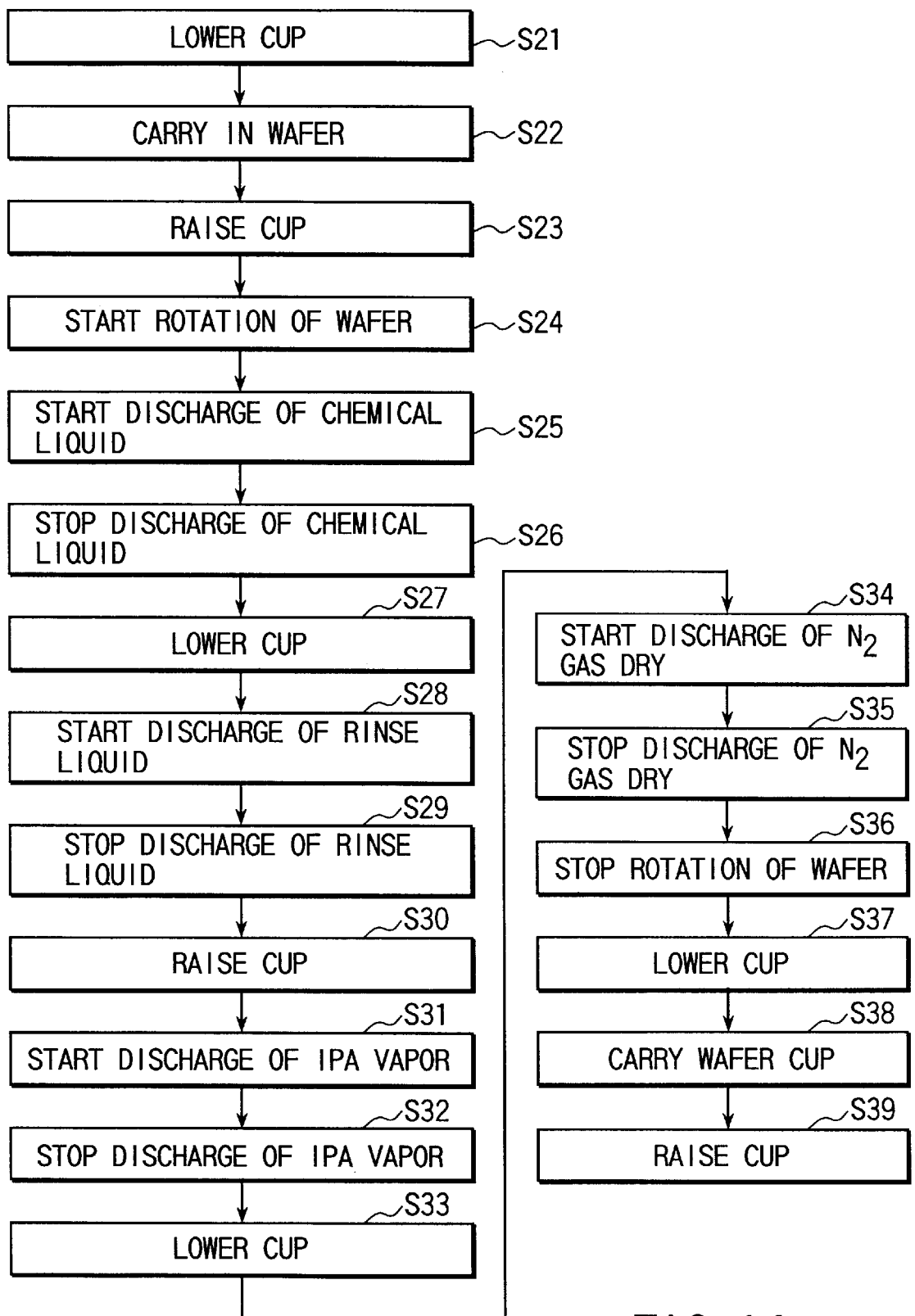
FIG. 14 is a flow chart illustrating a washing/drying method according to another embodiment of the invention.

The washing/drying process apparatus of the second embodiment is provided as process unit 7A in the washing process system 1 shown in FIG. 1. As is shown in FIG. 13, the washing/drying process apparatus 7A comprises various process fluid supply mechanisms 130 and 131 and drive mechanisms 23, 148 and 149. The process apparatus 7A is surrounded by housing panels and formed as unit 7a. A casing 7b is provided within the unit 7a, A spin chuck 10 and a cup 20 are provided within the casing 7b. The spin chuck 10 and cup 20 are the same as described above.

The first process fluid supply mechanism 130 functions to supply a chemical solution as a first process fluid and pure water as a second process fluid to the wafer W. The supply mechanism 130 comprises a first nozzle 128, a nozzle support member 132, a chemical solution supply source 102, pure water supply source 104, a horizontal arm 138, a swing mechanism (not shown), and an elevation mechanism 148. The swing mechanism (not shown) functions to swing the horizontal arm 138 in a horizontal plane. The swing mechanism 138 is substantially the same as the mechanism 50, 51 shown in FIG. 2. The elevation mechanism 148 comprises an air cylinder whose air supply source (not shown) is controlled by a controller 160. The elevation mechanism 148 elevates the horizontal arm 138. The nozzle support member 132 is provided at a free end portion of the horizontal arm 138. The first nozzle 128 is attached to a lower part of the nozzle support portion 132.

The chemical solution supply source 102 communicates with a line tube 135 via a valve 134 and comprises a plurality of tanks, a mass flow meter, a mixer, and a temperature control mechanism (all not shown). The chemical solution supply source 102 supplies a chemical solution as a first process fluid. The chemical solution supply source 102 mixes, for example, ammonia solution and hydrogen peroxide solution at a predetermined ratio, controls the temperature of the mixture solution of ammonia and hydrogen peroxide, and supplies the mixture solution to the first nozzle 128. The first process fluid may be, for example, hydrofluoric acid solution.

The rinse liquid supply source 104 communicates with a line tube 137 via a valve 136, and comprises a tank, a mass flow meter and a temperature control mechanism (all not shown). The rinse liquid supply source 104 supplies a rinse liquid as a second process fluid. The supply source 104 controls the temperature of, for example, pure water and supplies it to the first nozzle 128. The line tubes 135 and 137 communicate with a common line tube 33. The common line tube 33 communicates with the first nozzle 128 via an internal passage in the nozzle support member 132. The common line tube 33 communicates with the circulation circuit 80. A chemical solution regenerated by the circulation circuit 80 and recovery tank 71 is fed to the common pipe 33.

The second process fluid supply mechanism 131 functions to supply IPA vapor as a first process fluid and dry nitride gas as a second process fluid to the wafer W. The supply mechanism 131 comprises a second nozzle 129, a nozzle support member 140, an IPA vapor supply source 106, a dry nitride gas supply source 108, a horizontal arm 145, a swing mechanism (not shown), and an elevation mechanism 149. The swing mechanism (not shown) functions to swing the horizontal arm 145 in a horizontal plane and is substantially the same as the mechanism 50, 51 shown in FIG. 2. The elevation mechanism 149 comprises an air cylinder whose air supply source (not shown) is controlled by the controller 160. The elevation mechanism 149 elevates the horizontal arm 145. The nozzle support member 140 is provided at a free end portion of the horizontal arm 145. The second nozzle 129 is attached to a lower part of the nozzle support portion 140.

The IPA vapor supply source 106 communicates with a line tube 142 via a valve 141, and comprises a plurality of tanks, a mass flow meter, a mixer, and a temperature control mechanism (all not shown). The IPA vapor supply source 106 mixes, for example, IPA vapor and dry nitrogen gas at a predetermined ratio, controls the temperature and humidity of the mixture gas, and supplies the mixture gas to the second nozzle 129. It should be noted that IPA vapor alone may be supplied to the second nozzle 129.

The dry nitrogen gas supply source 108 communicates with a line tube 144 via a valve 143 and comprises a tank, a mass flow meter and a temperature/humidity control mechanism (all not shown). The dry nitrogen gas supply source 108, for example, controls the temperature and humidity of dry nitrogen gas and supplies it to the second nozzle 129. The opening/closing drive units of the valves 134, 136, 141 and 143 are controlled by the controller 160.

The elevation mechanism 23 for elevating the cup 20 will now be described.

The elevation mechanism 23 is provided below the cup 20. The elevation mechanism 23 comprises a motor 24, a driving pulley 24a, a timing belt 25, a driven pulley 26a, ball nut 26b and a ball screw 26c. An upper end portion of the ball screw 26c is rotatably coupled to the lower part of the cup 20, and a lower end portion of the ball screw 26c is rotatably coupled to a stationary frame (not shown). The ball nut 26b is engaged the ball screw 26c and coupled to the driven pulley 26a. The timing belt 25 is passed between the pulleys 24a and 26a. The operation of the motor 24 is controlled by the controller 160.

The elevation mechanism 23 vertically moves the cup 20 such that the level of the opening 20e varies in a range between an upper position P1 and a lower position P2. Specifically, the cup opening 20e is located at position P0 when the cup 20H indicated by a solid line in FIG. 13 is in the home position. The opening 20e is located at position P1 when the cup 20U indicated by an imaginary line in FIG. 13 is in its upper position, and at position P2 when the cup 20L indicated by an imaginary line in FIG. 13 is in its lower position.

In this description, the position of the wafer W relative to the cup 20 when the cup opening 20e is at the upper position P1 is defined as "first relative height position", and the position of the wafer W relative to the cup 20 when the opening 20e is at the home position P0 or lower position P2 is defined as "second relative height position."

With reference to FIGS. 14, 15A to 15D and 4, the process of washing, rinsing and drying the semiconductor wafer W with use of the above apparatus will now be described.

The wafer W is taken out of the cassette C by the sub-arm mechanism 3, and the wafer W is transferred from the sub-arm mechanism 3 to the main arm mechanism 5. The main arm mechanism 5 carries it to the washing/drying process apparatus 7.

If the wafer W to be processed has reached the apparatus 7, the cup 20 is lowered and the cup opening 20e is located at the lower position P2, as shown in FIG. 15A (step S21). The shutter (not shown) is opened and the wafer holder of the main arm mechanism 5 is introduced into the casing 7b. The wafer W is placed on the spin chuck 10 (step S22). The wafer W is located higher than the cup opening 20e. The wafer holder of the main arm mechanism 5 is retreated from the casing 7b and the shutter (not shown) is closed.

Subsequently, the cup 20 is raised and the cup opening 20e is located at the higher position P1, as shown in FIG. 15B (step S23). At this time, the wafer W is in the "first relative height position" relative to the cup 20. Specifically, the wafer W is located sufficiently below the cup opening 20e, and the wafer W is completely surrounded by the cup 20. The nozzle support member 132 is moved so that the nozzle 128 is located above the center of rotation of the wafer W. The distance L1 between the discharge port of first nozzle 128 and the upper surface of the wafer W is set at 10 mm to 15 mm.

The rotation of the spin chuck 10 is started (step S24), and the discharge of the chemical solution as first process fluid from the first nozzle 128 is started (step S25). The chemical solution is spread over the entire upper surface of the wafer W by centrifugal force, and the upper surface of wafer W is uniformly chemically washed. The chemical solution is centrifugally separated from the wafer W and applied to the inner wall of the cup 20. The applied chemical solution flows down along the inner wall of the cup 20. The waste liquid (chemical solution) flows from the cup 20 through the exhaust pipe 21 to the recovery circuit 70 shown in FIG. 4. A gas component is separated and removed from the waste liquid by the gas-liquid separator 72. The waste liquid is then stored in the tank 72. The waste liquid is circulated from the tank 71 to the circulation circuit 80 by the pump 83 and heated by the heater 85. Impurities in the waste liquid is then removed by the filter 86 and returned to the tank 71. Through this circulation, the waste liquid in the tank 71 is purified. The thus regenerated liquid is supplied for reuse to the first nozzle 128 through the return circuit 33.

After a predetermined wash process time, the valve 134 is closed and the discharge of chemical solution from the first nozzle 128 is stopped (step S26). The rotational speed of the spin chuck 10 is switched from low level to high level and the liquid on the wafer W is centrifugally separated and removed.

The cup 20 is lowered and the cup opening 20e is set at the home position $P_0$, as shown in FIG. 15C (step S27). At this time, the wafer W is located slightly below the cup opening 20e ("second relative height position).

The valve 136 is opened and the discharge of pure water as second process fluid from the first nozzle 128 is started (step S28). The pure water is spread over the entire upper surface of the rotating wafer W due to centrifugal force, and the upper surface of the wafer W is uniformly rinsed. At this time, the pure water centrifugally separated from the wafer W is applied to the over-hang portion 20f of the cup and flows down from the over-hang portion 20f. Thus, the chemical solution on the entire inner wall of the cup 20 is removed. Specifically, the upper surface of the wafer W and the inner wall of the cup 20 are simultaneously rinsed.

After a predetermined rinse process time, the discharge of pure water from the first nozzle 128 is stopped and the first nozzle 128 is retreated from the position above the wafer W (step S29). The rotational speed of the spin chuck 10 is switched from the low level to high level and the liquid on the wafer W is centrifugally separated and removed.

Then the cup 20 is raised and the cup opening 20e is located at the upper position $P_1$, as shown in FIG. 15B (step S30). At this time the wafer W is set at the "first relative height position" relative to the cup 20. Specifically, the wafer W is located sufficiently below the cup opening 20e and the wafer W is completely surrounded by the cup 20.

The nozzle support portion 140 is moved and the second nozzle 129 is located at a point above the center of rotation of the wafer W. The second nozzle 129 is approached to the wafer W and the distance L2 between the discharge port of second nozzle 129 and the upper surface of wafer W is set at 2 mm to 8 mm.

The discharge of IPA vapor as first process fluid from the second nozzle 129 is started (step S31). A predetermined amount of $N_2$ gas is mixed in the IPA vapor. The IPA vapor is spread over the entire upper surface of the wafer W, and water on the upper surface of the wafer W is removed. Part of the IPA vapor is liquefied and the liquefied IPA flows down along the inner wall of the cup as waste liquid. The waste liquid (IPA liquid) flows through the discharge pipe 21 from the cup 20 to another recovery circuit (not shown). A gas component is separated and removed from this waste liquid by another gas-liquid separator (not shown) and stored in another tank (not shown). In addition, the waste liquid (IPA liquid) is circulated from the tank to another circulation circuit (not shown) by another pump (not shown), heated by a heater (not shown), passed through a filter (not shown) to remove impurities, and returned to the tank. The waste liquid in the tank is purified through the circulation circuit. The thus regenerated liquid is returned to the supply source 106 through another return circuit (not shown) for reuse.

After a primary drying process time, the valve 141 is closed and the discharge of IPA vapor from the second nozzle 128 is stopped (step S32).

Subsequently the cup 20 is lowered and the cup opening 20e is set at the home position $P_0$, as shown in FIG. 15C (step S33). At this time, the wafer W is located slightly lower than the cup opening 20e ("second relative height position").

The valve 143 is opened and the discharge of dry $N_2$ as second process liquid from the second nozzle 129 is started (step S34). The dry $N_2$ gas is spread over the entire upper surface of the rotating wafer W and thus the upper surface of wafer W is finally dried. At this time, the dry $N_2$ gas bounces off the wafer W, hits the over-hang portion 20f of the cup 20, and flows down along the inner wall of the cup 20 from the over-hang portion 20f. Thus, the entire inner wall of the cup 20 is dried. Specifically, the upper surface of the wafer W and the inner wall of the cup 20 are simultaneously finally dried.

After a predetermined final dry process time, the valve 143 is closed and the discharge of dry $N_2$ gas from the second nozzle 129 is stopped (step S35). Then, the second nozzle 129 is retreated from the position above the wafer W and the rotation of the wafer W is stopped (step S36).

Subsequently, the cup 20 is lowered and the cup opening 20e is set at the lower position P2, as shown in FIG. 15D (step S37). At this time, the wafer W is located slightly above the cup opening 20e. The shutter (not shown) is opened and the wafer holder of main arm mechanism 5 is introduced into the casing 7b. The wafer W is taken up from the spin chuck 10 and carried out of the apparatus 7 (step S38). The shutter (not shown) is closed, the cup 20 is raised, and the cup opening 20e is set at the home position $P_0$ (step S39).

The wafer W carried out of the process apparatus 7A is transferred to the next process apparatus 8. In the process apparatus 8, too, a similar washing/drying process is performed. At last, the wafer W is finally washed with pure water and dried in the process apparatus 9. The processed wafer W is restored to the cassette C and the wafer W along with the cassette C is carried out of the wash process system 1.

According to the above embodiment, the inner wall of the cup 20 including the over-hang portion 20f is rinsed in real time and dried in real time with the second process fluid (pure water, $N_2$ gas). Accordingly, the inner wall of the cup 20 is always kept in a clean state. Thus, contamination with particles on the wafer W is effectively prevented.

In addition, according to the above embodiment, almost all the amount of the first process fluid (chemical solution, IPA) is recovered and reused.

Therefore, the amount of consumed first process fluid (chemical solution, IPA) can be greatly reduced.

Furthermore, the spin chuck 10, cup 20, process fluid supply mechanism 130, 131, recovery circuit 50, tank 51 and return circuit 33 are arranged within single unit 7a, the length of the recovery circuit 50 and return circuit 33 is decreased and the chemical solution, etc. can be recovered and reused with the area occupied by the single apparatus. Accordingly, the area occupied by the wash process system 1 decreases, the manufacture of semiconductor devices can be facilitated, and the productivity of semiconductor devices is enhanced.

In the above embodiment, the system for washing and drying the semiconductor wafer W has been described by way of example. The present invention is not limited to this embodiment and is applicable to a washing/drying process system for other substrates such as LCD glass substrates.

In the above embodiment, the system for washing/drying the upper surface (circuit pattern formation surface) alone of the semiconductor wafer W has been described by way of example. This system may be combined with a bottom-surface process apparatus for washing/drying a bottom surface of the wafer W.

A third embodiment of the present invention will now be described with reference FIGS. 16 and 17. A description of the parts common to those in the first and second embodiments is omitted.

The washing/drying process apparatus of the third embodiment is provided as process apparatus 7B in the wash process system 1 shown in FIG. 1. As is shown in FIG. 16, the washing/drying process apparatus 7B comprises a cup 20, a spin chuck 220, a surface (upper surface) process nozzle 230 and a bottom-surface process nozzle 231.

The spin chuck 220 has a table 221 for supporting a peripheral portion of a bottom surface of wafer W. An upper surface of the table 221 has a conical shape with a diameter increasing from its center toward its periphery. A pool 240 is formed on the upper surface 222.

A plurality of pins 23 for guiding and aligning the wafer W are erected on the peripheral portion of the table 221. As is shown in FIG. 17, three sets of aligning pins 223, each set comprising three pins, are disposed at three locations (the total number of pins being nine). In addition, three notches 224 are formed at peripheral portions of the table 221 for transfer of the wafer W.

A rotary shaft 225 is attached to the lower surface of the table 221 of spin chuck 220. A pulley 226 is attached to the rotary shaft 225. A torque of a motor 227 is transmitted to the pulley 226 through another pulley 228 and a belt 229.

A top-surface process nozzle 230 for applying a chemical solution and a rinsing solution to the upper surface of wafer W is movably provided above the spin chuck 220. The nozzle in the first embodiment or second embodiment may be used for the top-surface process nozzle 230.

A bottom-surface process nozzle 231 communicates with an internal passage 232 in the rotary shaft 225 and opens to a lowermost portion of the pool 240. The internal passage 232 communicates with a pure water supply source (not shown). Pure water is supplied to the nozzle 231 through the internal passage 232 and discharged from the nozzle 231 to the pool 240. The discharge port of the nozzle 231 faces a central area of the bottom surface of the wafer W on the table 221. The atmosphere in the cup 20 is exhausted from the bottom of the cup 20 by a vacuum pump (not shown) provided outside.

A description will now be given of the processing of the upper surface and lower surface of the wafer W by the apparatus 7B.

The wafer W is placed on the table 221 of spin chuck 220. The spin chuck 220 is rotated at a speed of, e.g. 20 rpm.

Then a chemical solution is discharged from the nozzle 230 to the upper surface of wafer W, and pure water is discharged from the nozzle 231 to the lower surface of wafer W. Thus, the upper surface and lower surface of wafer W are simultaneously processed.

If the chemical solution washing of the upper surface of wafer W is finished, pure water is supplied from the nozzle 230 to rinse the upper surface of wafer W.

On the other hand, when the lower surface of wafer W is to be rinsed, pure water is jetted from the nozzle 231 to a central area of the lower surface of the rotating wafer W. The pure water is uniformly spread by centrifugal force from the center of the lower surface of the wafer toward the periphery thereof. In addition, it should suffice to quietly supply pure water from the nozzle 231 to the pool 240. The pure water in the pool 240 flows from the center of the pool 240 toward the periphery there of by centrifugal force, and overflows through a gap between the wafer W and table 221. The pure water spattered to the surrounding of the wafer W by centrifugal force flows down along the inner wall of cup 20 and exhausted through discharge pipes 21. Since pure water is constantly supplied from the nozzle 231, as described above, fresh pure water is always fed from the center toward the periphery of upper surface 222 of spin chuck 220.

In this manner the entire lower surface of wafer W is rinsed. Since pure water is constantly supplied to the lower surface of wafer W during the rinsing step, the lower surface of wafer is coated with pure water without contact with outside air After a predetermined process time, the supply of pure water from the nozzle 231 is stopped and the washing process for the lower surface of wafer W is finished. Subsequently, the spin chuck is rotated at higher speed, pure water is removed from the lower surface of wafer W, and the lower surface of wafer W is subjected to a drying process. Not only pure water but also a chemical solution for chemical washing may be applied to the lower surface of wafer W.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus for washing and drying substrates one by one, comprising:

a spin chuck for holding a substrate such that a surface thereof to be processed faces upward and for rotating the substrate;

a process fluid supply mechanism for selectively supplying one or two or more of a plurality of kinds of process fluids to the surface to be processed of the substrate rotated by the spin chuck;

a dry gas supply mechanism for selectively applying one or more of a plurality of kinds of dry gases to the surface to be processed of the substrate rotated by the spin chuck;

a nozzle assembly having a first discharge port and a second discharge port communicating with the process fluid and dry gas supply mechanism respectively, the first discharge port discharging a first process fluid which is in a liquid phase under conditions of room temperature and atmospheric pressure, and the second discharge port discharging a second process fluid which is in a gas phase under conditions of room temperature and atmospheric pressure, the first discharge port and the second discharge port being adjacent to each other in the nozzle assembly;

a driving mechanism for moving the nozzle assembly to a location above the substrate held by the spin chuck; and a controller for controlling operations of the process fluid and dry gas supply mechanisms and the driving mechanism.

2. The apparatus according to claim 1, wherein the first discharge port and the second discharge port are arranged concentrically at a lower part of the nozzle assembly.

3. The apparatus according to claim 1, wherein the first discharge port and the second discharge port are arranged symmetrically at a lower part of the nozzle assembly.

4. The apparatus according to claim 1, wherein the driving mechanism comprises a horizontal arm for supporting the nozzle assembly, a vertical drive shaft for supporting the horizontal arm, and drive means for rotating the vertical drive shaft and swinging the nozzle assembly along with the horizontal arm in a horizontal plane.

5. The apparatus according to claim 1, wherein the first discharge port discharges a chemical solution, the second discharge port discharges a dry gas, and said apparatus further comprises a third discharge port for discharging a rinse liquid.

6. The apparatus according to claim 1, wherein the first discharge port discharges a chemical solution for chemical washing, the second discharge port discharges a first dry gas, and said apparatus further comprises a third discharge port for discharging pure water for rinsing and a fourth discharge port for discharging a second dry gas.

7. An apparatus for washing and drying substrates one by one comprising:

a cup having at an upper part thereof an opening for loading and unloading a substrate;

a spin chuck for holding and rotating the substrate within the cup;

a process fluid supply mechanism having a plurality of nozzles for discharging and supplying a process fluid to the substrate held by the spin chuck;

a rinse liquid supply mechanism having a nozzle for discharging and supplying a rinse liquid to the substrate held by the spin chuck;

a relative elevation mechanism for relatively and vertically moving at least one of the cup and the spin chuck, thereby varying a positional relationship between the substrate on the spin chuck and the cup; and a controller for controlling said relative elevation mechanism such that said relative elevation mechanism sets the opening of the cup at a position lower than the spin chuck at the time of loading/unloading the substrate on/from the spin chuck, and sets the opening of the cup at a position higher than the spin chuck at the time of supplying the process fluid to the substrate.

8. The apparatus according to claim 7, wherein the cup has an over-hang portion projecting inward so as to surround said opening and receiving the process fluid dispersed from the rotating substrate.

9. The apparatus according to claim 7, wherein the process fluid supply mechanism comprises a first nozzle for discharging to the substrate a process fluid which is in a liquid phase under conditions of room temperature and atmospheric pressure and a second nozzle for discharging to the substrate a process fluid which is in a gas phase under conditions of room temperature and atmospheric pressure, and the apparatus further comprises first elevation means for elevating the first nozzle and second elevation means for elevating the second nozzle.

10. The apparatus according to claim 7, further comprising:

a recovery circuit communicating with a lower part of the cup;

a recovery/regeneration tank communicating via the recovery circuit with a lower part of the cup, for recovering and regenerating the process fluid exhausted from the cup; and a return circuit for returning the regenerated process fluid from the recovery/regeneration tank to the process fluid supply mechanism.

11. The apparatus according to claim 10, wherein the cup, the spin chuck, the process fluid supply mechanism, the recovery circuit, the recovery/regeneration tank and the return circuit are arranged within a single unit.

12. The apparatus according to claim 10, wherein the recovery circuit comprises:

a gas-liquid separation mechanism for separating the recovered process fluid into a liquid component and a gas component;

a drain circuit for exhausting part of the liquid component separated by the gas-liquid separation mechanism; and a three-way valve for effecting switching between the drain circuit and the recovery circuit.

13. The apparatus according to claim 10, wherein the recovery/regeneration tank includes a circulation circuit for circulating the recovered process fluid, and the circulation circuit includes a pump, a damper, a heater, a filter and a change-over valve.

14. An apparatus for washing and drying substrates one by one, comprising:

a cup having at an upper part thereof of an opening for loading and unloading a substrate;

a spin chuck for holding and rotating the substrate within the cup, the spin chuck having a conical pool with a diameter decreasing from a periphery thereof toward a center thereof, the pool facing a lower surface of the held substrate, a process fluid supply mechanism having a plurality of nozzles for discharging and supplying a process fluid to the substrate held by the spin chuck;

a relative elevation mechanism for relatively and vertically moving at least one of the cup and the spin chuck, thereby varying a positional relationship between the substrate on the spin chuck and the cup; and a third nozzle opening at a lowermost part of the pool, the third nozzle supplying at least one of a rinse liquid and a chemical solution from at least one of said process fluid supply mechanism and said rinse liquid supply mechanism, to the pool.

* * * * *